(12) United States Patent
Kitch

(10) Patent No.: US 6,200,900 B1
(45) Date of Patent: Mar. 13, 2001

(54) METHOD FOR FORMATION OF AN AIR GAP IN AN INTEGRATED CIRCUIT ARCHITECTURE

(75) Inventor: Vassili Victor Kitch, San Ramon, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/415,315

(22) Filed: Oct. 8, 1999

(51) Int. Cl.[7] ................................................. H01L 21/311
(52) U.S. Cl. ........................ 438/695; 438/699; 438/702
(58) Field of Search .................................. 438/624, 626, 438/695, 699, 700, 701, 702; 257/522

(56) References Cited

U.S. PATENT DOCUMENTS

| | | | |
|---|---|---|---|
| 5,641,712 | * 6/1997 | Grivna et al. | 438/624 |
| 5,759,913 | * 6/1998 | Fulford, Jr. et al. | 438/624 |
| 5,869,880 | 2/1999 | Grill et al. | 257/522 |
| 5,880,026 | * 3/1999 | Xing et al. | 438/688 |
| 5,904,569 | 5/1999 | Kitch | 438/692 |
| 5,949,143 | * 9/1999 | Bang | 257/758 |
| 6,035,530 | * 3/2000 | Hong | 29/885 |

* cited by examiner

Primary Examiner—Benjamin L. Utech
Assistant Examiner—Kin-Chan Chen
(74) Attorney, Agent, or Firm—Limbach & Limbach, LLP

(57) ABSTRACT

Capacitance between interconnects lines of a semiconductor device is reduced by providing air voids between the interconnects. The air voids are produced by depositing a dielectric over and partially between the pairs of interconnects and the substrate between them, and etching (preferably by sputter etch) in a controlled and coordinated manner so as to produce air voids in the dielectric between the interconnects. The tops of the air voids are below the level to which the uppermost surfaces of the interconnect is then exposed during subsequent processing so that the air voids remain intact during such subsequent processing.

8 Claims, 3 Drawing Sheets

METHOD FOR FORMATION OF AN AIR GAP IN AN INTEGRATED CIRCUIT ARCHITECTURE

BACKGROUND AND PRIOR ART

This emulsion relates to fabrication of semiconductor devices, and more particularly to a method of reducing capacitance between interconnect lines in such circuits or devices.

An integrated circuit includes numerous conductors extending across the topography of a substrate. Components within a system are electrically connected by sets of interconnect lines or conductors. With a constant trend towards decreasing the size of integrated circuits and increasing the capacity of circuits of a specific size, the number of interconnects per integrated circuit or semiconductor device has been on the increase. This has resulted in a decrease or reduction in spacing between interconnect lines on a single device. However, as the spacing between interconnect lines is reduced, intralevel capacitance between the interconnect lines increases.

It is important, therefore, to reduce the capacitance between interconnect lines to minimize cross-talk between them and decreases in semiconductor device speed.

A number of different expedients have been proposed and/or used to reduce the intralevel capacitance between interconnect lines in a semiconductor device. One such approach in general has been to use a material having a low dielectric constant between the interconnect lines. Note, however, that air has a relative dielectric constant of 1.0, substantially lower than the dielectric constants of most other materials conventionally used. For this reason, some approaches in the prior art to the problem of reducing capacitance between interconnect lines in a single device have involved the creation of air voids between the interconnects.

One such process is described in U.S. Pat. No. 5,641,712 of Grivna et al. In this process a first conventional dielectric layer is disposed over a device comprising a number of interconnect lines disposed over a substrate. The dielectric layer, which may be a nitride or preferably an oxide formed from a silane source gas using a chemical vapor deposition (CVD) process, forms what is termed in that patent "breadloaf" shapes over the interconnect lines. The dielectric layer is then etched to remove a top portion of it and leave spacers formed by the bottom portions around the interconnect lines. Then, an additional deposition process is used to provide an electrically insulating layer or dielectric layer over the spacers, the interconnect lines and the substrate. The gaps between the interconnect lines and spacers are nearly but not completely filled in by the dielectric layer. Then, an etch, preferably a sputter etch, is used to redistribute the material in the dielectric layer, closing off the part of the gaps to produce sealed air-filled voids between the interconnect lines. One or more additional layers of material may be then deposited atop the overall device.

Another process which produces air-filled voids is described in U.S. Pat. No. 5,759,913 of Fulford et al. In this process an hygroscopic dielectric is disposed on the substrate between interconnect lines. A dielectric material is then deposited on the device, forming structures similar to the "breadloaf" structure of Grivna et al. This deposition is preferably carried out by CVD and uses typical materials such as oxide, nitride, and/or oxynitride. The deposition temperature is chosen to be one which permits outgassing or desorption of moisture from the hygroscopic dielectric during the deposition process. Such outgassing minimizes or substantially prevents deposition of the dielectric on the substrate or on the lower surfaces of the interconnects just above the substrate. Then, a fill dielectric is deposited on the previously deposited dielectric, particularly on the upper surface or sidewalls of the hygroscopic dielectric. This deposition is carried out at a lower temperature which does not trigger sufficient amounts of outgassing necessary to overcome deposition upon the material. This results in an air-filled void which is said to be completely encased between the two deposited dielectrics.

The processes described in both of these patents produce voids which extend above the upper surfaces of the adjacent interconnects (and optionally even below the lower surfaces of such interconnects). These processes are quite satisfactory for producing air voids between interconnects in which both the interconnects and the void are covered by a layer of material such as dielectric from that point forward in the process. However, in a more recently developed process, such as that described in U.S. Pat. No. 5,504,569, planarizing or polishing is carried down to the top surface of interconnects and/or below. This processing step would break through the top of any air voids formed according to the Grivna et al. or Fulford et al. processes, thus destroying their usefulness, since any subsequent treatment would simply fill the (now broken) voids with material having a higher dielectric constant than air.

This invention provides a process for producing air voids between interconnects and similar structures in semiconductor devices in which the air filled voids terminate below the uppermost surfaces of such structures which are to be exposed in subsequent planarization or similar processing.

SUMMARY OF THE INVENTION

This invention relates to a method for forming an air void between a pair of integrated circuit interconnects on a semiconductor device, comprising:
 (a) providing a semiconductor device having a substrate and at least one pair of parallel interconnects with a gap between them disposed over the substrate and;
 (b) conducting a combination of deposition and etching processes comprising:
   (i) depositing a first dielectric layer over the pair of interconnects and partially into the gap between them; and
   (ii) etching the first dielectric layer so as to create a tapered profile thereof;
Steps (i) and (ii) being conducted so as to create and seal an air void in the first dielectric layer, and between the interconnects, the highest point of the air void being located below the uppermost portion of the interconnects to be exposed in subsequent processing.

BRIEF DESCRIPTION OF THE DRAWINGS

FIG. 1 depicts parallel interconnects disposed over a substrate in a semiconductor device.

FIGS. 2 and 3 show stages of the formation of air voids according to this invention.

FIG. 4 shows an embodiment of the product of this invention.

FIG. 5 shows a step in the formation of interconnects as shown in FIG. 1.

FIGS. 6 and 7 show embodiments of the invention in which air voids are integrated into interconnect architecture as described, for instance, in U.S. Pat. No. 5,904,569.

DETAILED DESCRIPTION OF THE INVENTION

The figures illustrate generally, and with reference to a specific process for forming semiconductors, the method for forming an air void between interconnects according to this invention. They mainly show a particular embodiment of this process, as incorporated in an overall process for producing self-aligned interconnects using high selectivity metal pillars and a via exclusion mask. A process of this type is described in more detail in co-pending U.S. patent applications 295,838 and 295,898, both filed Apr. 21, 1999, which in turn are continuations-in-part of co-pending and commonly assigned application Ser. No. 08/923,859 filed Sep. 3, 1997, now U.S. Pat. No. 5,904,569 titled METHOD FOR FORMING SELF-ALIGNED VIAS IN MULTI-LEVEL METAL INTEGRATED CIRCUITS. The disclosures of these applications are hereby incorporated by reference herein.

Figure 1:
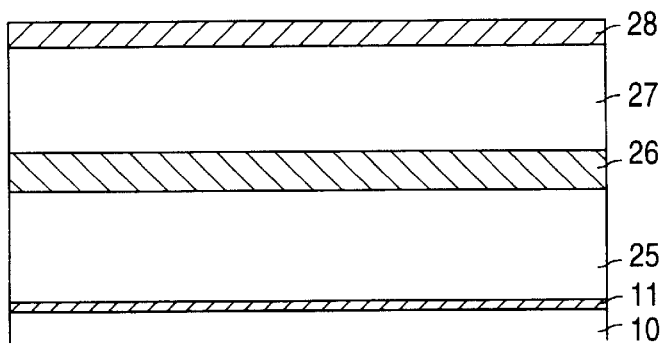
FIGS. 1–7 illustrate process steps of one embodiment of the method in accordance with the present invention.

FIG. 1 depicts the early stage of construction of an integrated circuit at the beginning of the process of this invention.

Figure 2:
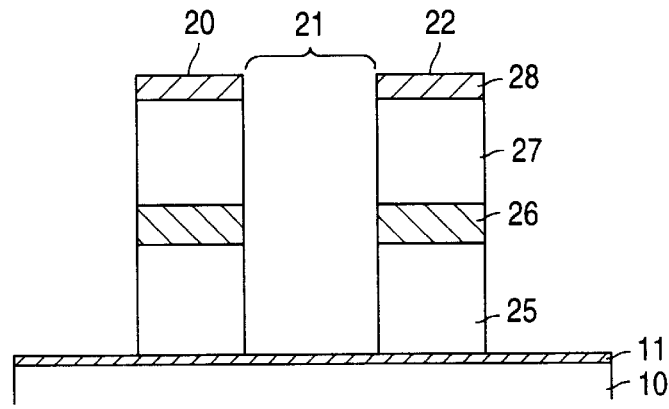

In FIG. 1, layers of conductive metals 25 and 27 have been deposited sequentially on substrate 10 and oxide layer 11. Layer 26 is comprised of nitrides and serves as an etch stop layer in subsequent processing. Layer 28 is comprised of nitrides and serves as an antireflective layer during photoprocessing. Then, portions of these layers are selectively etched using a pattern mask and one or more etching agents to produce pairs of parallel interconnects 20 and 22, as shown in FIG. 2. If copper is used in layers 25 and/or 27, a layer of a diffusion barrier is then deposited on the structure. The diffusion barrier is comprised of a material which is a good barrier against copper diffusion. Tantalum, tungsten, titanium and their nitrides are suitable for use in the diffusion barrier.

FIG. 2 depicts the stage of construction at the beginning of the process of this invention. As shown in FIG. 2 a pair of parallel spaced interconnects generally indicated as 20 and 22 are disposed on a semiconductor substrate 10. A gap, generally indicated as 21, exists between the interconnects. In one embodiment, as shown in this Figure, a layer of oxide 11 is situated on top of the silicon substrate 10 between it and the interconnects 20 and 22. This oxide layer 11 is an optional layer, but is typically present to provide dielectric between the substrate and the interconnects.

Preferably, as shown in FIG. 2, interconnects 20 and 22 are composed of a series of layers of conductive material including metals such as aluminum, titanium, tantalum, tungsten, copper etc. and/or metal compounds, for example nitrides of these metals. Interconnects having multiple layers of metals and/or metal compounds are produced as is known in the art, by a series of sequence of deposition and etching steps, including conducting one or more such steps using a mask. The specific nature of the interconnects 20, 22 etc. is not significant to the process of this invention, which involves creating an air void between interconnects so as to decrease the dielectric constant between them.

Figure 3:
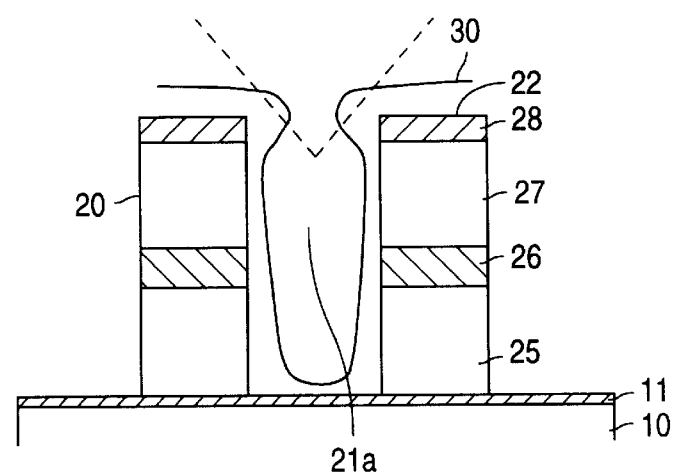

FIG. 3 shows the next stage of the process. As shown in this Figure a layer 30 of dielectric material, for example silicon dioxide, is deposited so as to cover the interconnects and to begin to fill the space or gap 21 between them. As the layer is deposited a "breadloaf" shape is formed as a result of mass transport. That is, more of the dielectric source gas is available at an upper surface of an interconnect structure as compared to a lower surface of one. Thus, more dielectric is deposited over the interconnects than over the gaps between them and there tends to form the breadloaf structure, which tends to narrow the gap 21 to a smaller gap 21a but not completely fill it in.

Up to this point the process in general resembles that of the Grivna et al. U.S. Pat. No. 5,641,712 except that, as opposed to Grivna et al., no "spacers" are used. However, in the Grivna et al. process, the air voids which are formed protrude above the upper surfaces of the interconnects. This is not a problem in processes in which the entire assembly is overlaid with a layer of dielectric oxide, as in the Grivna et al. process described in that patent. However, when part or all of the semiconductor assembly is to be made level with the top surfaces of the interconnects (during processing) such air voids would completely lose their value as they would be opened up by techniques such as planarizing or CMP (chemical-mechanical polishing) and thus be totally ineffective to carry out their function.

A significant feature of the process of this invention is that the air void between the pairs of interconnects is constructed and situated such that its highest point is below the uppermost portion (or surface) of the interconnects which is to become exposed in the process of fabricating the semiconductor device. In most cases this level will be that of the uppermost portion of the interconnects as constructed above. If, for instance, further processing will expose only the upper surface of the interconnects, then the air void can be constructed such that its top is below the upper surface of the interconnects. This will typically be the case.

Construction of the air void is accomplished by carrying out the deposition of the oxide or dielectric layer 30 in coordination with an etching process, preferably a sputter etch process, which can cut off the rounded breadloaf portion of the deposited dielectric layer 30 so as to create a tapered profile of this material and at the same time pinch off the narrower top of the air gap 21a. The sputter etching process, as is known in the art, operates so as to cut the corners of the breadloaf shapes at approximately a 45° angle from the vertical, with respect to both of the interconnects. This is indicated by the dotted lines in FIG. 3, with the result shown in FIG. 4.

In carrying out the process of this invention the deposition of oxide layer 30 and the sputter etching to taper the oxide below the upper surfaces of the pair of interconnects is carried out in coordination. This is in contrast to the prior art such as the Grivna et al process in which sputter etching is carried out after the deposition of the oxide layer to form the breadloaf shapes has been completed. The coordination of the deposition and etching processes can be carried out by performing the two concurrently, or alternating back and forth. With appropriate control, the deposition and sputter etch processes respectively may be performed in that sequence, providing that the highest point of the air void which is formed is located below the uppermost surface of the interconnects to be exposed subsequently. With either continued simultaneous deposition and etching, or repeated alternating between the two, the tapered profile created by the etching eventually results in closing and sealing of the air void.

Figure 4:
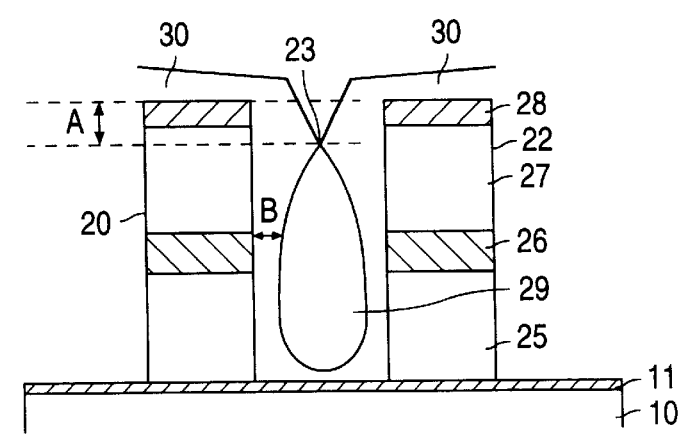

For instance, the deposition/etching ratio can be controlled so as to vary the size of the dimensions A and B indicated on FIG. 4, with dimension A being the distance between the top of the interconnects 20 and 22 and the uppermost portion 23 of the air void 29 and dimension B representing the distance between the vertical side of the interconnect 20 and the air void. The carrying out of the deposition and etching processes can be conducted so as to situate the uppermost point of the air void at any desired distance (A) below the top of the pair of the interconnects and to achieve a desirable distance or thickness (B).

For example, the etching/deposition ratio is generally represented as a value of from zero to 1, with zero representing deposition only and ±∞ representing etching only. A ratio of 1 indicates that the etching and deposition processes are being carried out equally.

In running the deposition and etching processes concurrently the ratio of deposition to etching is controlled and maintained so as to deposit to a greater extent and etch to a lesser extent in order to create the void 29. Generally the process commences with a etching/deposition ratio of close to zero, that is, nearly all deposition and little if any etching. As the deposition proceeds, the ratio of the two is changed to increase the amount of etching so as to cut the corners of the breadloaves in order to produce and seal the air void. The decision on when to switch from predominantly deposition to more etching depends on the process and on the aspect of ratio of the interconnects, i.e. their height and the width of the gap between them. In addition, the deposition and etching must be controlled so as to create an oxide fill in the gap having a width B sufficiently great so as to provide structural integrity to this section of the eventual integrated circuit device.

The specific operating parameters and conditions (number of deposition/etching repetitions, size of dimensions A and B, etc.) to construct air voids in accordance with this invention will depend on the size and materials used in the interconnects and other portions of the semiconductor device, and other considerations. Thus, for each type of device the operating conditions and parameters will be determined empirically. However, this can be done with no more than typical and routine experimentation. As will be seen in FIGS. 6–7, in some processes a portion of the interconnects may be removed during processing. Therefore, unless the thickness of the oxide B surrounding the air void is sufficient to maintain structural integrity of the remaining deposited oxide, these sections could collapse. However, in order to provide a good reduction in capacitance between the interconnect lines, the width of the air void 29 should be maximized as much as possible. This size will depend on matters such as the sizes of the interconnects and the gap between them, the nature of the dielectric, etc. Typically the width of this air void at its widest point should be up to about ⅔ the width of this original gap 21. Distance B would typically thus be about at least ⅙ of this original gap.

As mentioned above the deposition and etching could be carried out simultaneously or alternately, that is, alternating between deposition and etching with the ratio of the two still being controlled so as produce the desired air void and surrounding oxide structure, as mentioned above. Apparatus currently available from companies such as AMAT, Novellus and Watkins and Johnson is capable of simultaneously carrying out the deposition and etching processes.

Figure 5:
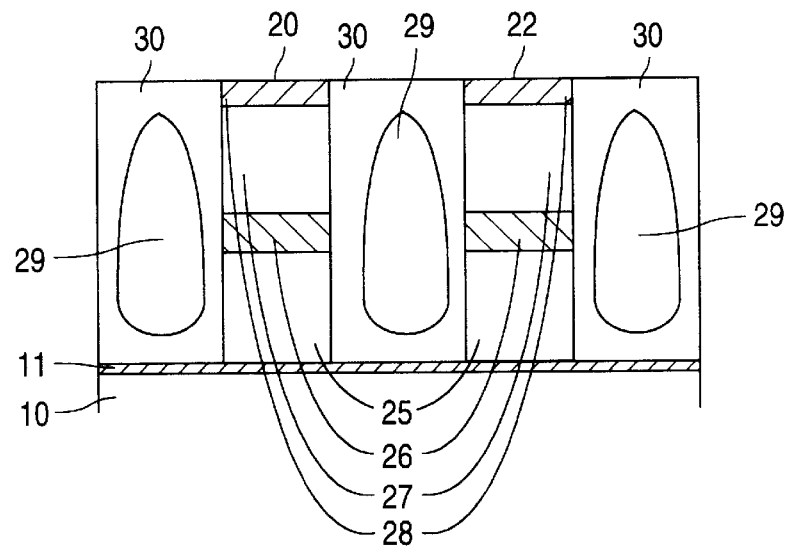

FIG. 5 shows a cross section of a semiconductor device after planarization, for example after use of a chemical mechanical process (CMP) to planarize down to the level of the top of the interconnects 20 and 22, exposing their tops. The portion of dielectric layer 30 above the tops of the interconnects has been removed. The interconnects are separated from each other by air voids 29 and remaining portions of dielectric layer 30 which fill the gaps between the interconnects and surround the air voids.

Figure 6:
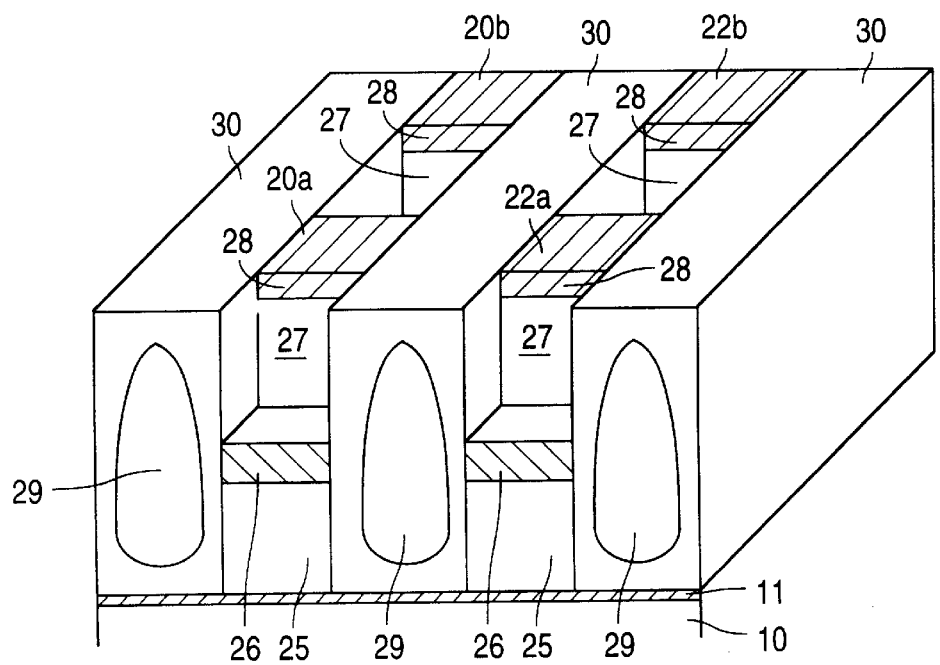
Figure 7:
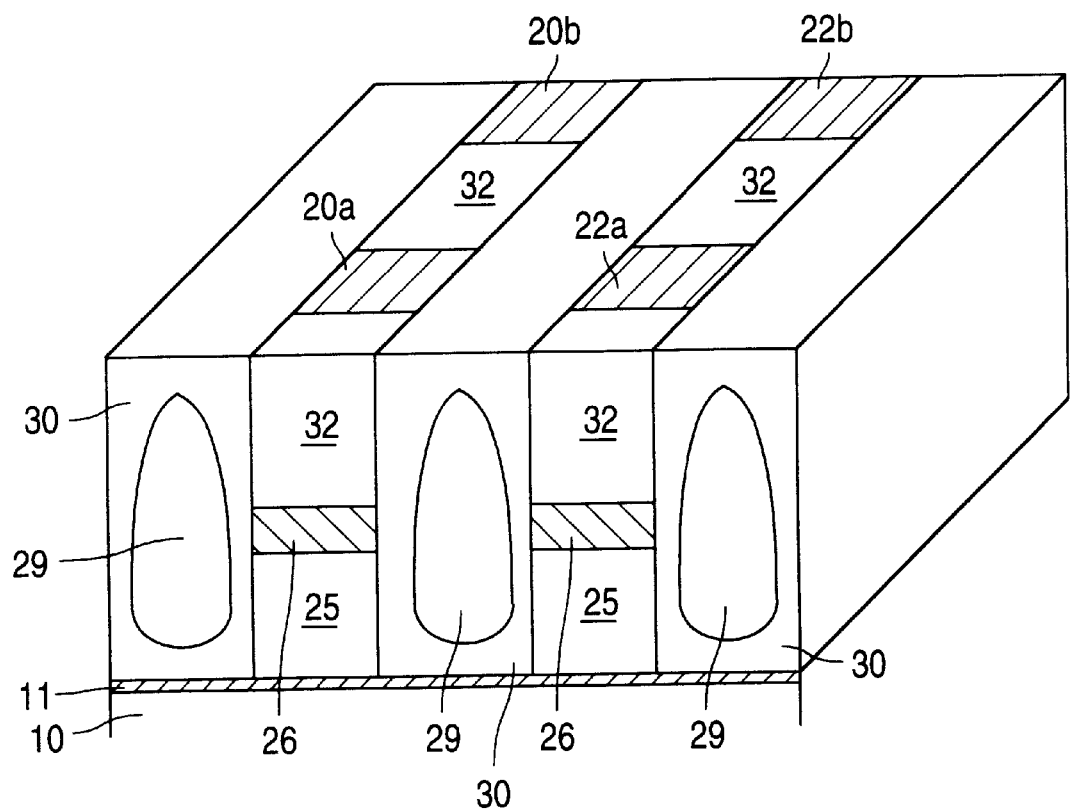

FIGS. 6 and 7 depict the inclusion of this invention in a process for producing semiconductor devices having vias for connection to other such devices. FIG. 6 shows an angular view of the same device as shown in FIG. 5 after portions of the interconnects have been etched away using a mask to provide vias 20a, 20b, 22a, 22b. This may be performed, for instance by a process as described in U.S. Pat. No. 5,904,569, the contents of which is incorporated herein by reference.

In FIG. 6 the interconnects are shown as formed of layers of metals and/or metal compounds, as shown in FIG. 2. The upper two layers 27 and 28 of the interconnects have been selectively etched by appropriate techniques, with layer 26 serving as an etch stop. The remaining portions of the interconnects (20a, 20b, 22a, 22b), serve as vias to connect the metal levels of this structure with metal levels of another structure placed atop of it, via an intermediate metal level. Thus, portions of the original interconnect remain as shown at 20a, 20b, 22a and 22b whereas other portions have been partially etched and reduced in height.

Note that, as mentioned previously, portions of the oxide 30 are no longer laterally supported by the interconnects. Therefore, dimension B of FIG. 4, that is, the width of the oxide surrounding the air void, must be sufficient so as to maintain the structural integrity of this portion of the semiconductor device at this time. Subsequently, as shown in FIG. 7, the gaps in the overall semiconductor structure are filled by deposition and chemical mechanical polishing of additional dielectric or material 32.

Various other modifications and alterations in the method of this invention and the products produced therefrom will be apparent to those skilled in the art. Though the invention has been described in connection with specific preferred embodiments, it should be understood that the invention as claimed should not be unduly limited to such specific embodiments. The following claims are intended to define the scope of the invention and the structures and methods within the scope of these claims and their equivalents are intended to be covered thereby.

What is claimed is:

1. A method for forming an air void between a pair of integrated circuit interconnects on a semiconductor device comprising:

(a) providing a semiconductor device having a substrate and at least one pair of parallel interconnects with a gap between them disposed over the substrate; and (b) conducting a combination of deposition and etching processes comprising:

(i) depositing a first dielectric layer over the pair of interconnects and partially into the gap between them; and (ii) etching the first dielectric layer so as to create a tapered profile thereof;

steps (i) and (ii) being conducted so as to create and seal an air void in the first dielectric layer and between the interconnects, the highest point of the air void being located below the uppermost portion of the interconnects that are exposed in subsequent processing.

2. A method according to claim 1 in which steps (i) and (ii) are conducted concurrently.

3. A method according to claim 1 in which steps (i) and (ii) are conducted in an alternating fashion.

4. A method according to claim 1 in which the air void is sufficiently large so as to produce reduced capacitance between the pair of interconnects but not sufficiently large so as to adversely affect the structural integrity of the portion of the dielectric layer situated between the air voids and the interconnects.

5. A method according to claim 1 in which the highest point of the void is located at a point below the uppermost portion of the interconnects.

6. A method according to claim 1 in which the interconnects are comprised of two or more layers of materials, at least one layer being of an electrically conductive metal and at least one other layer being of a nitride of titanium, tantalum, tungsten, copper or aluminum.

7. A method according to claim 6 in which the electrically conductive metal is selected from one or more of aluminum, titanium, tantalum, tungsten or copper.

8. A method according to claim 6, further comprising:

(c) selectively etching at least one layer of the interconnects to form a patterned portion thereof, with one or more substantially unetched portions of the uppermost etched layer thereby defining spaced-apart via pillars and one or more lower layers of electrically conductive metal;

(d) depositing a second layer of dielective over the device such that said second layer fills gaps between the via pillars; and (e) planarizing the second dielectric layer to expose an upper surface of the via pillars.

* * * * *